(12) United States Patent
Yoffe et al.

(10) Patent No.: US 11,637,654 B2
(45) Date of Patent: Apr. 25, 2023

(54) OFDM PACKING AND LDPC FRAMING FOR CONSTELLATION SHAPING IN NG WLANS

(71) Applicant: Intel Corporation, Santa Clara, CA (US)

(72) Inventors: Yaron Yoffe, Rishon LeTsiyon (IL); Assaf Gurevitz, Ramat Hasharon (IL); Elad Meir, Ramat Gan (IL); Shlomi Vituri, Tel Aviv (IL); Qinghua Li, San Ramon, CA (US); Xiaogang Chen, Portland, OR (US); Feng Jiang, Sunnyvale, CA (US)

(73) Assignee: Snap Inc., Santa Monica, CA (US)

( * ) Notice: Subject to any disclaimer, the term of this patent is extended or adjusted under 35 U.S.C. 154(b) by 72 days.

(21) Appl. No.: 16/998,528

(22) Filed: Aug. 20, 2020

(65) Prior Publication Data
US 2020/0382139 A1    Dec. 3, 2020

Related U.S. Application Data

(60) Provisional application No. 62/889,711, filed on Aug. 21, 2019.

(51) Int. Cl.
*H03M 13/00* (2006.01)
*H04L 1/00* (2006.01)
(Continued)

(52) U.S. Cl.
CPC ....... *H04L 1/0042* (2013.01); *H03M 13/1102* (2013.01); *H03M 13/255* (2013.01);
(Continued)

(58) Field of Classification Search
None
See application file for complete search history.

(56) References Cited

U.S. PATENT DOCUMENTS

| | | | |
|---|---|---|---|
| 10,142,055 B2* | 11/2018 | Jeong | H04L 1/0045 |
| 10,411,737 B2* | 9/2019 | Kim | H03M 13/3761 |
| 2010/0115372 A1* | 5/2010 | Trachewsky | H03M 13/1102 |
| | | | 714/790 |

(Continued)

OTHER PUBLICATIONS

Amjad, Rana Ali, "Fixed-to-variable length distribution matching", 2013 IEEE International Symposium on Information Theory, (2013), 5 pgs.

(Continued)

*Primary Examiner* — Mujtaba M Chaudry
(74) *Attorney, Agent, or Firm* — Schwegman Lundberg & Woessner, P.A.

(57) ABSTRACT

An apparatus for a station (STA) configured for operating in a next-generation (NG) wireless local area network (WLAN) comprises the processing circuitry configured to modify probabilities of constellation points to generate a more Gaussian distribution. In these embodiments, for LDPC framing and OFDM packing, the transmitter circuitry may be configured to compute a number of output bits ($b_{out}$) to be transmitted based on a number of payload bits ($b_{in}$) at an output of a shaping encoder, a shaping rate ($r_{shaping}$), and an overhead percent ($B_{overhead}$). A shaping gain of up to 1.53 dB may be achieved. A new shaping encoder is provided to address the issue that the number of bits is not fixed.

17 Claims, 4 Drawing Sheets

(51) Int. Cl.
    H03M 13/25    (2006.01)
    H03M 13/11    (2006.01)
    H04L 5/00     (2006.01)
    H04L 27/26    (2006.01)

(52) U.S. Cl.
    CPC ... *H03M 13/6356* (2013.01); *H03M 13/6362* (2013.01); *H04L 1/0071* (2013.01); *H04L 5/0007* (2013.01); *H04L 27/2634* (2013.01)

(56) References Cited

U.S. PATENT DOCUMENTS

| | | | | |
|---|---|---|---|---|
| 2015/0365266 | A1* | 12/2015 | Zhang | H04L 1/0009 |
| | | | | 370/329 |
| 2017/0187491 | A1* | 6/2017 | Jang | H03M 13/1117 |
| 2017/0264316 | A1* | 9/2017 | Lee | H03M 13/1128 |
| 2018/0097580 | A1* | 4/2018 | Zhang | H04L 1/0041 |
| 2018/0183465 | A1* | 6/2018 | Vivier | H03M 13/6522 |
| 2019/0334653 | A1* | 10/2019 | Jeong | H03M 13/6356 |
| 2020/0145092 | A1* | 5/2020 | Jung | H04B 7/0413 |
| 2020/0252080 | A1* | 8/2020 | Lam | H03M 13/112 |

OTHER PUBLICATIONS

Bocherer, Georg, "Bandwidth Efficient and Rate-Matched Low-Density Parity-Check Coded Modulation", IEEE Transactions on Communications (vol. 63, Issue: 12, (Dec. 2015), 15 pgs.

Forney, G, "Efficient modulation for band limited channels", IEEE Journal on Selected Areas in Communications vol. 2, Issue: 5, (Sep. 1984), 16 pgs.

Gallager, R G, "Information Theory and Reliable Communication", Hoboken, NJ, USA: Wiley, (1968), 604 pgs.

Gultekin, "Constellation shaping for IEEE 802.11", 2017 IEEE 28th Annual International Symposium on Personal, Indoor, and Mobile Radio Communications (PIMRC). IEEE, (2017), 7 pgs.

Raphaeli, D, "Constellation shaping for pragmatic turbocoded modulation with high spectral efficiency", IEEE Transactions on Communications, vol. 52, No. 3, (Mar. 2004), 5 pgs.

Shannon, C. E., "A Mathematical Theory of Communication", The Bell System Technical Journal, 27, (1948), 379-423, 623-656.

Yankov, Metodi, "Rate-adaptive constellation shaping for near-capacity achieving turbo coded BICM", 2014 IEEE International Conference on Communications (ICC), (2014), 6 pgs.

* cited by examiner

OFDM PACKING AND LDPC FRAMING FOR CONSTELLATION SHAPING IN NG WLANS

PRIORITY CLAIM

This application claims priority under 35 U.S.C. 119(e) to U.S. Provisional Patent Application Ser. No. 62/889,711, filed Aug. 21, 2019 [reference number AC4361-Z] which is incorporated herein by reference in its entirety.

TECHNICAL FIELD

Embodiments pertain next-generation (NG) wireless local area networks (WLANs) (i.e., Extremely High Throughput (EHT). Some embodiments relate to constellation shaping in NG WLANs. Some embodiments relate to low-density parity check (LDPC) framing and orthogonal frequency division multiplexed (OFDM) packing in NG WLANs.

BACKGROUND

Wireless devices are becoming widely prevalent and are increasingly requesting access to wireless channels. The Institute of Electrical and Electronics Engineers (IEEE) is developing one or more standards that utilize Orthogonal Frequency-Division Multiple Access (OFDMA) in channel allocation. One issue is efficiency and throughput. Thus, there are general needs for techniques that improve efficiency and throughput in NG WLANs.

DETAILED DESCRIPTION

Figure 1:
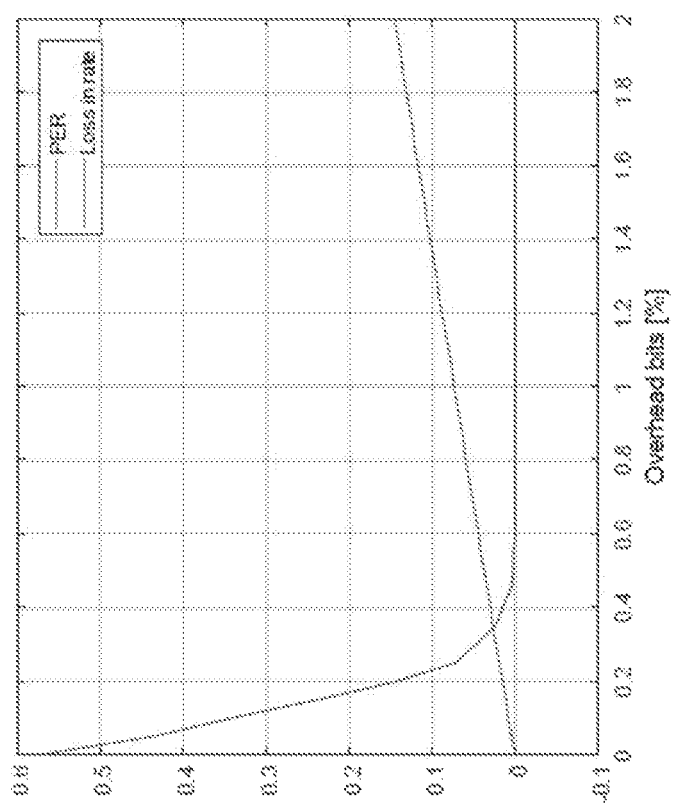
FIG. 1 illustrates the probability to exceed the expected number vs the number of overhead bits in accordance with some embodiments.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

In 1948, Shannon has proved that reliable communication over AWGN channel is possible only if the information rate (measured in bits/channel use) does not exceed the capacity of the channel.

$$C = \frac{1}{2}\log(1 + SNR) \quad (1)$$

where SNR is the signal-to-noise-ratio. The derivation assumes that the transmitted signal has maximal entropy/power, which can be achieved only if the input distribution is Gaussian. This strategy, of course, is impractical as continuous distributions cannot be generated in real-life systems.

Embodiments disclosed herein introduce an efficient scheme, which aims to reduce the shaping loss. Our scheme is based on non-even probabilities of the PAM/QAM signals. By modifying the probabilities, we generate a Gaussian like shape, which carries the same amount of information using less power.

The common approach in modern communication is to transmit finite lattice constellations, such as PAM/QAM. The actual information rate of PAM signals can be calculated directly by measuring the mutual information between the input and the noisy output. The difference between the achievable information rate of PAM signals and Shannon formula can be seen. The shaping loss is in known to be 1.53 dB as the rate goes to infinity.

Some embodiments disclosed herein improve the efficiency and throughput of wireless communication systems. In some embodiments, the probabilities of the constellation points are modified making the distribution more similar to a Gaussian distribution. In some embodiments, a shaping gain of up to 1.53 dB can be achieved. In some embodiments, a new shaping encoder is provided to address the issue that the number of bits, which should be transmitted into the channel, is not fixed. In some embodiments, the shaping encoded may address the issue that the exact number is known only after the entire payload sequence is processed. The technical problem which arise from the shaping encoding process is the OFDM and framing process, which becomes more complex once the length of the transmitted sequence is not deterministic.

In some embodiments, the transmitter uses the systematic bits to generate the QAM amplitudes, uses the parity bits (with some parity bits to increase the code rate if needed) to generate the QAM sign bits, and uses a shaping encoder to generate the systematic bits from the input payload bits.

Some embodiments are directed to an apparatus for a station (STA) configured for operating in a next-generation (NG) wireless local area network (WLAN). In some embodiments, the apparatus may comprise transmitter circuitry, including processing circuitry, and memory. In some embodiments, for LDPC framing and OFDM packing, the transmitter circuitry may be configured to divide data bits into LDPC codewords, add shortening bits when necessary, and map a coded bit stream into QAM symbols and into OFDM tones for transmission. In some embodiments, for the LDPC framing and OFDM packing, the transmitter circuitry may be configured to compute a number of output bits ($b_{out}$) to be transmitted (i.e., transmitted bits) [stage 1] based on a number of payload bits ($b_{in}$) at an output of a shaping encoder, a shaping rate ($r_{shaping}$), and an overhead percent ($B_{overhead}$). In some embodiments, the transmitter circuitry may also be configured to calculate a number of OFDM symbols ($N_{sym}$) based on the number of output bits ($b_{out}$) to be transmitted and a number of data bits per OFDM symbol ($N_{dbps}$) [stage 2], and calculate a number of LDPC codewords ($N_{CW}$) based on a number of codebits per LDPC codeword ($N_{LDPC}$), the code rate ($R_{ldpc}$), and the number of output bits ($b_{out}$) [stage 3]. In some embodiments, the transmitter circuitry may also be configured to calculate a number of shortening bits ($N_{shrt}$) (i.e., zero bits) to be appended to a LDPC codeword based on the number of output bits ($b_{out}$), a number of shorting bits per codeword ($N_{SPCW}$) and a number of codewords with additional shorting bits ($N_{SPCW1}$). In some embodiments, the transmitter circuitry may also be configured to append a number of repetition bits ($N_{rep}$) after LDPC encoding [stage 4] based on whether an LDPC code rate matches a ratio between amplitude bits and sign bits of a target QAM level. In some embodiments, the transmitter circuitry may also be configured to perform OFDM packing by adding the number of repetition bits ($N_{rep}$) after interleaving to fill the number of OFDM symbols ($N_{sym}$) including adding an additional OFDM symbol when a number of total coded bits ($N_{TCB}$) does not be fit into the number of OFDM symbols ($N_{sym}$). These embodiments are described in more detail below.

In some embodiments, the processing circuitry configured to modify probabilities of constellation points to generate a more Gaussian distribution. In these embodiments, for LDPC framing and OFDM packing, the transmitter circuitry may be configured to compute a number of output bits ($b_{out}$) to be transmitted (i.e., transmitted bits) [stage 1] based on a number of payload bits ($b_{in}$) at an output of a shaping encoder, a shaping rate ($r_{shaping}$), and an overhead percent ($B_{overhead}$). The transmitter circuitry may also be configured to divide payload bits into LDPC codewords, add shortening bits, and map a coded bit stream into QAM symbols and into OFDM tones for transmission. In these embodiments, for the LDPC framing and OFDM packing, the transmitter circuitry may also be configured to compute a number of output bits ($b_{out}$) to be transmitted based on a number of payload bits ($b_{in}$) at an output of a shaping encoder, a shaping rate ($r_{shaping}$), and an overhead percent ($B_{overhead}$). These embodiments are described in more detail below.

The LDPC framing and OFDM packing procedure is crucial to enable this feature in existing Wi-Fi standards. The main issue is that the shaping encoder block is a fixed-to-variable transformation. That is, the number of output bit is not fixed, even though the number of input bits is fixed.

This interferes with the existing LDPC framing and OFDM packing procedure. In the current standard, the number of payload bits is known, and used to determine how to generate a coded OFDM packet. Three criterions must be met in order to generate a valid packet: (a) the number of input bits for each LDPC code word is fixed and (b) the number of total coded bits should be equal to the number of bits in OFDM symbols and (c) the number of OFDM symbols should be known in advance, so it could be transmitted in the headers.

Currently, the number of payload bits is used to calculate the following:

Number of payload bits in each LDPC code-word and number of shortening bits. Shortening bits refer to '0' padding bits that are used as input for the LDPC encoder for a fixed number of input bits but are not actually transmitted.

Number of puncturing bits and repetition bits. After the LDPC encoding is performed, the number of coded bits is compared with the number of bits that should appear in the packet. In this stage puncturing or repetition is applied. In puncturing, parity bits are not transmitted and thus, the number of is reduced. If puncturing is not possible, repetition of the bits is used to add bits.

Some embodiments provide a solution for the LDPC and OFDM framing when the CS method is applied. The solution addresses 3 issues:

LDPC Framing

Fixed relation between the number of amplitudes bits and number of parity bits (that are used as MSB/sign bits)

OFDM packing—mapping bits into QAM symbols and OFDM tones.

Transmitter Operation:

LDPC AND OFDM framing

The purpose of the LDPC and OFDM framing is to divide the data into LDPC words and add zero bits if necessary (shortening bits). In addition, the coded bits stream is mapped into QAM symbols and into OFDM tones.

The transmitter operates according to the following stages:

Stage 1: Calculating the Number of Transmitted Bits.

We suggest to do the computation by first evaluating the number of bits at the output of the shaping encoder and bound the maximal number of bits (add overhead bits). If the number of bits which was predicted is exceeded, the last bits in the frame are not transmitted. We choose a number that ensures that this will happen rarely—with probability much lower than the required packet-error-rate. In another embodiment, if the number of bits exceeds what is predicted, the number of OFDM symbols may be increased by one or more.

If the number of output bits at the shaping encoder is lower than estimated, additional padding bits are added. For long enough sequences, the amount of overhead bits (bits that are added for fixed length) is negligible compared to the number of payload bits. Hence, the degradation in throughput will be arbitrary small.

An example is given in FIG. 1 which shows the probability of error (due to larger number than expected) compared to the number of overhead bits (%) for the case of 10 e4 bytes. In this case, we see that choosing even small number of 0.6% overhead bits leads to negligible packet-error-rate (PER). Increasing the number of bits beyond 10 e4 bytes, would decrease the required overhead bits for a given error probability.

In some embodiments, the formula used to compute the number of bits is $$b_{out} = \left\lceil b_{in} \cdot \frac{1}{\text{Entropy}(p_r)} \cdot (M_{pam} - 1) + B_{overhead} \right\rceil \quad (2)$$

Where Entropy($p_r$) is the entropy of the probability set being used in units of bits/symbol. From another point of view, Entropy($p_r$) is the average number of payload bits represented by the I/Q amplitude of each QAM symbol and determined by the shaping table. ($M_{pam}-1$) is the number of bits/amplitude of one PAM symbol. $B_{overhead}$ is the number of bits that are added as overhead. Equation (1) may be rewritten as $$b_{out} = \left\lceil \frac{b_{in}}{r_{shaping}} \right\rceil,$$

where the rate $r_{shaping}$ represents the expected ratio between input bits and output bits. $r_{shaping}$ is determined by the shaping table (probabilities of the symbols) and/or the number or percentage of the overhead bits.

To ease the notations, the relation between the number of output bits and input bits will be described only using the $r_{shaping}$ parameter (the term entropy is not required and will not be further used in this document). For each rate, a different $r_{shaping}$ will be given.

For example, let us consider the following scenario:

$$b_{in} = 1e4, \text{ PAM32, enrtopy}(p_r) = 3\left[\frac{\text{bits}}{\text{symbol}}\right],$$

$$R_{ldpc} = \frac{2}{3}, N_{codeword} = 1944.$$

We estimate the number of output bits as $$b_{out} = \left\lceil 1e4 \cdot \frac{1}{3} \cdot (5-1) + B_{overhead} \right\rceil = \lceil 1.3333e4 + B_{overhead} \rceil$$

For example, if $B_{overhead}$ is selected as 1% of the input, the number of output bits can be computed as $$b_{out} = \left\lceil 1e4\left(\frac{4}{3} \cdot 0.01\right) \right\rceil = \left\lceil \frac{1e4}{r_{shaping}} \right\rceil, \text{ where } r_{shaping} = \left(\frac{4}{3} + 0.01\right)^{-1}.$$

Now, we inclusively explain the transmitter operation:

Stage 2: Calculating the Number of OFDM Symbols.

Once the number of output bits is known, the number of OFDM symbols is calculated using the following equation:

$$N_{sym} = \left\lceil \frac{b_{out}}{N_{dbps}} \right\rceil \quad (3)$$

Where $N_{dbps}$ is the number of data bits per OFDM symbol. It is worth noting that this operation is not invertible, therefore the receiver cannot deduce the number of the output bits based on $N_{sym}$ alone. Equivalently, we cannot assume that $b_{out}$ is divided by $N_{dbps}$ without reminder.

Therefore, two modes of operation are defined:

(1) In this operation mode padding bits are added to the payload bits such that $$N_{sym} = \frac{b_{out}}{N_{dbps}}.$$

The relation between the input bits and bits at the output of the shaper encoder is $b_{in} = b_{out} \cdot r_{shaping}$ as mentioned. This approach is similar to 80.11ac/ax LDPC encoding procedure. In this case, only $N_{sym}$ is transmitted in the headers (it is sufficient to deduce the number of payload bits $b_{in}$).

(2) If padding bits are not added, the exact number of bits—$b_{out}$ or bytes should be transmitted in the headers. The number of payload bits $b_{in}$ can be restored via Eq. (1).

This is further discussed in the receiver operation section.

Stage 3: Calculating the Number of LDPC Codewords.

The next stage is calculating the number of LDPC codewords:

$$N_{CW} = \left\lceil \frac{b_{out}}{N_{LDPC}R_{ldpc}} \right\rceil, \quad (4)$$

where $N_{LDPC}$ is the number of codebits per LDPC codeword; $R_{ldpc}$ is the code rate of the LDPC.

Stage 4: Calculating the Number of Shortening Bits.

The number of shortening bits (zero bits) which are appended to complete full LDPC is calculated as follows:

$$N_{shrt} = \max(0, (N_{CW} \cdot N_{LDPC} \cdot R_{ldpc}) - b_{out}) \quad (5)$$

$$N_{spcw} = \left\lfloor \frac{N_{shrt}}{N_{CW} \cdot (M_{pam}-1)} \right\rfloor (M_{pam}-1),$$

where $N_{spcw}$ stands for number of shortening bits per codeword. The division by $(M_{pam}-1)$ and multiplication after the floor operation ensures that the shortening bits are appended as full amplitudes. This is essential for ensuring a fixed relation between number of amplitudes and parity bits, as will be elaborated in the following sub-section.

Ideally, each LDPC codeword has the same amount of shortening bits. In most cases, the number of shortening bits is not a multiple of the number of LDPC codewords. In these cases, some codewords may have $(M_{pam}-1)$ or one more shortening bits than the others. The number of codewords with additional shortening bits can be calculated as $N_{spcw1} = \text{rem}(N_{shrt}, N_{CW} \cdot (M_{pam}-1))$. where rem represents the reminder operation. The number of additional bits that is added to each codeword is exactly $(M_{pam}-1)$.

Stage 4: Add Repetition Bits.

In the suggested method the relation between parity and amplitudes bits must be fixed. However, if shortening is applied prior to coding, than the number of amplitudes will be lower than expected.

In this case we suggest to append repetition of data bits (amplitude bits). If the LDPC code rate matches the ratio between amplitude bits and sign bits of the targeted QAM, the number of repetition bits in this case is exactly the same as the number of shortening bits and is known in advance. This ensures fixed number of amplitudes and fixed relation between them and the number of parity bits. We ensured that the number of repetition will be composed of full amplitudes using Eq. (4).

If the LDPC code rate doesn't match the ratio between the amplitude bits and the sign bits of the targeted QAM, repetition can be applied to increase the number of amplitude bits or puncturing can be applied to decrease the number of parity bits so that the ratio between the (increased) amplitude bits and (decreased) sign bits meets the required ratio of the targeted QAM.

At the receiver, LLR combining of the repetition bits may be applied to improve the performance.

Stage 5: Add Repetition Bits.

If the LDPC code rate matches the ratio between amplitude bits and sign bits of the targeted QAM, after the first two procedures are applied, the total number of coded bits would be exactly $N_{TCB} = N_{ldpc}N_{CW}$, where $N_{ldpc}$ is the number of coded bits in each code-word (including the parity bits) and $N_{CW}$ is the number of code words which were calculated at Stage 3. $N_{TCB}$ is the number of total coded bits.

Here we suggest to always add an additional OFDM symbol instead of puncturing, if the number of total coded bits $N_{TCB}$ cannot be fit into the number of OFDM symbols $N_{sym}$ calculated by Eq (2). The degradation in throughput will be negligible if the packet is long enough.

To fill up a complete number of OFDM symbols repetition should be applied.

The number of repetition bits would be $$N_{rep} = N_{sym} \cdot N_{CBPS} - N_{TCB}, \quad (6)$$

where $N_{CBPS}$ is the number of coded bits per symbol; $N_{sym}$ may be more than the one calculated from Eq. (2) by 1 or more. If the number of coded bits exceeds what the initial number of symbols can carry, one extra symbols is added. The receiver may be aware of whether an extra symbol is added by receiving an indication e.g. from the preamble or PHY header or MAC header or control channel.

Note that this repetition is applied after interleaver, thus the bit stream is already ordered according to the desired amplitudes and probabilities. Namely, the bit stream at this stage consists of segments of amplitudes and sign bits. Each segment represents an I or Q value of the targeted QAM using Grey mapping. Similar to Eq. (4), when the repetition bits are divided between codewords, the amplitudes are preserved—meaning that complete symbols are repeated. This leads to the following equation:

$$N_{repcw} = \left\lfloor \frac{N_{rep}}{N_{cw} \cdot M_{pam}} \right\rfloor \cdot M_{pam} \qquad (6)$$

Figure 2:
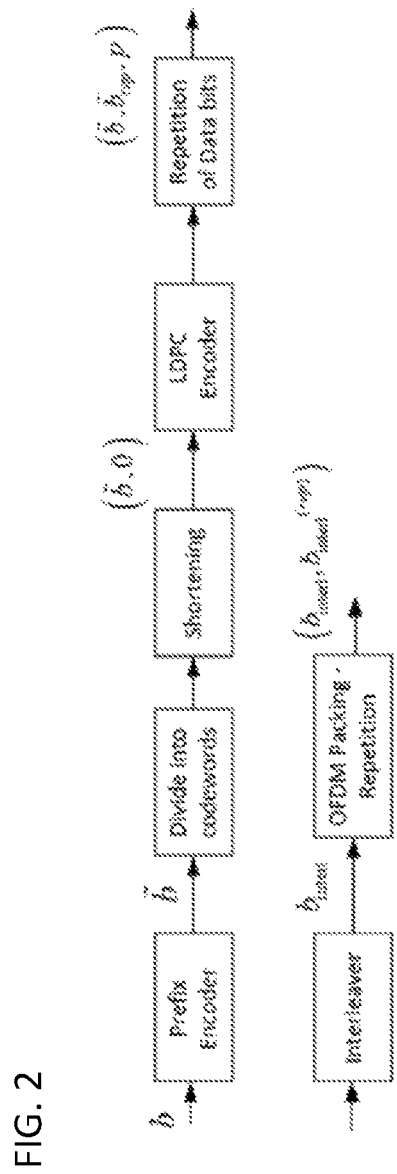
FIG. 2 illustrates a process performed by a transmitter configured for LDPC framing and OFDM packing in accordance with some embodiments.

The parity bits are distributed to segments of amplitude bits by an interleaver as shown in FIG. 2. One parity is assigned to every $M_{pam}-1$ bits. The parity bit is used as the sign bit in I or Q value mapping e.g. Grey mapping. The repeated I or Q value(s) may be the first ones in the LDPC codeword.

Ideally, each LDPC codeword has the same amount of repetition bits. In most cases, the number of repetition bits is not a multiple of the number of LDPC codewords. In these cases, some codeword(s) may have one more repeated I or Q value than the others. Similar to the case presented in Eq. (4), the number of codewords with an extra I or Q value ($M_{pam}$ bits) is given by $N_{repcw1}=\text{rem}(N_{rep}, N_{CW} \cdot (M_{pam}))$, where rem represents the reminder operation.

Figure 3:
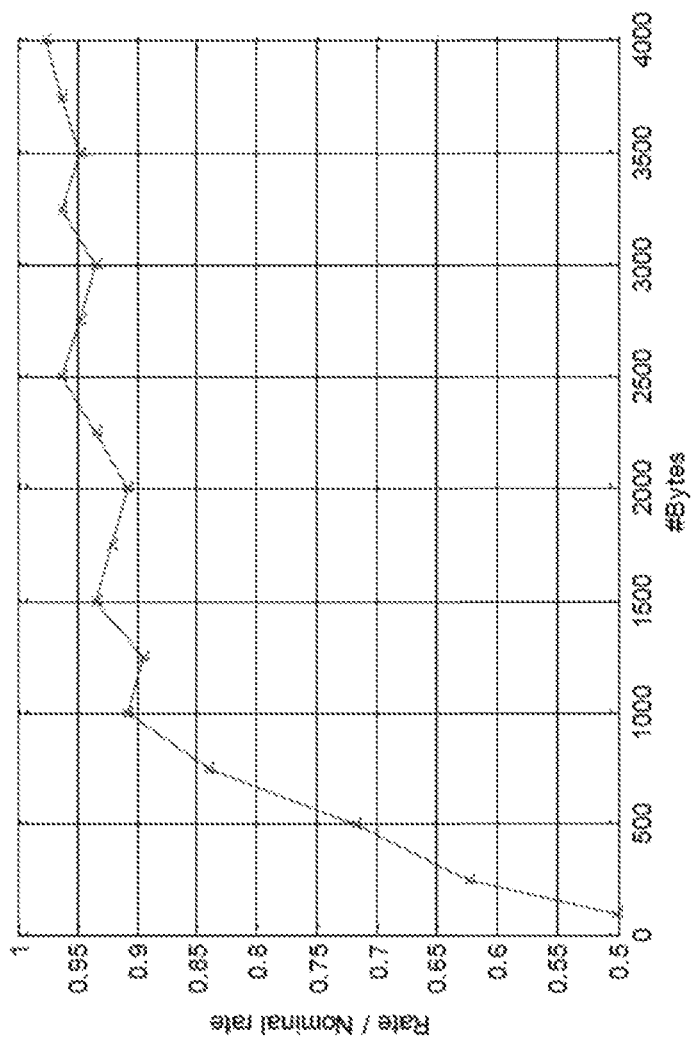
FIG. 3 illustrates throughput/nominal rate vs the number of payload bits with 2.5% overhead bits, in accordance with some embodiments.

The full procedure is illustrated in FIG. 2. In FIG. 3, we demonstrate how this procedure affect the throughput for 2.5% overhead bits and different number of payload bytes. It is shown that the actual throughput converges to 97.5% of the nominal rate as the number of payload bytes grows.

Receiver Operation:

In some embodiments, the receiver is required to perform inverse operation such that the payload bits can be extracted. To avoid ambiguity, several parameters should be known at receiver. We distinguish between the two cases as described in the transmitter operation, stage 2.

Case 1—Number of symbols. In this case, pad bits are added for complete number of OFDM symbols. Thus, the number of symbol is sufficient to deduce the number of payload bits.

Case 2—Number of bits ($b_{out}$). In this case, no padding bits were added, therefore, the number of payload bits should be implicitly transmitted to the receiver in the headers.

The receiver tracks the LDPC framing and OFDM packing parameters as follows:

Calculate $b_{out}$ based on $N_{sym}$ (only if $b_{out}$ was not transmitted in the headers, i.e. case 1).

Calculate the parameters $N_{shrt}$, $N_{spcw}$, $N_{spcw1}$, $N_{rep}$, $N_{rep1}$ according to Eq. (2)-(6).

Using these parameters, the LDPC decoding can be applied.

LLRs of repetition bits are combined with the first bits in each codeword and shortening bits are replaced with LLR (shrt)=$-\infty$ (or arbitrary large values).

At the last stage, the payload information bits are retrieved.

The shaping decoder sequentially operates on the output bits and produces segments of payload bits.

Since each MAC Protocol Data Unit (MPDU) ends with a delimiter signature bits, separation between MPDUs can be obtained even if in the presence of detection errors. Thus, error in one MPDU does not propagate to the following MPDUs.

In addition, the delimiter can be used to detect the exact number of overhead bits, which is the number of bits that are followed by the last delimiter.

Transmitter and Receiver Operation for Multiple-Input Multiple-Output (MIMO) Systems In case of MIMO operation mode, the same equations are used with slight modification. Since multiple data streams are transmitted, the amount of payload bits and coded bits in each OFDM symbol in multiplied by the number of streams.

Two parameters are modified:

$$N_{dbps}=N_{dbps}^{(ss)} \cdot N_{streams}$$

$$N_{cbps}=N_{cbps}^{(ss)} \cdot N_{streams}$$

Where $N_{dbps}^{(ss)}$, $N_{cbps}^{(ss)}$ are the number of data bits per OFDM symbol and coded bits per OFDM symbol respectively. $N_{streams}$ is the number of spatial streams.

The parameters $N_{dbps}^{(ss)}$, $N_{cbps}^{(ss)}$ are well defined in current standards.

Some embodiments disclosed herein provide a practical way to generate the non-even probabilities using a simple prefix encoder. Some embodiments disclosed herein provide a transmitter architecture that generates LDPC coded and shaped constellation according to pre-prescribed probabilities. Some embodiments disclosed herein provide a feasible receiver that calculates the LLRs for the LDPC decoder (prior knowledge of the input probabilities is assumed). In some embodiments disclosed herein, new constellation shaped modulation coding schemes (CS-MCSs) are derived. In some embodiments, the CS-MCSs define the modulation schemes (QAM order), probabilities of the constellation points and coding schemes, which also includes the interfaces between the coding and modulation.

In these embodiments, the system can transmit more information under specified output power or transmit the same amount of information using less output power. These embodiments do not require a complex receiver that uses iterative decoding schemes and uses a very simple encoder.

Figure 4:
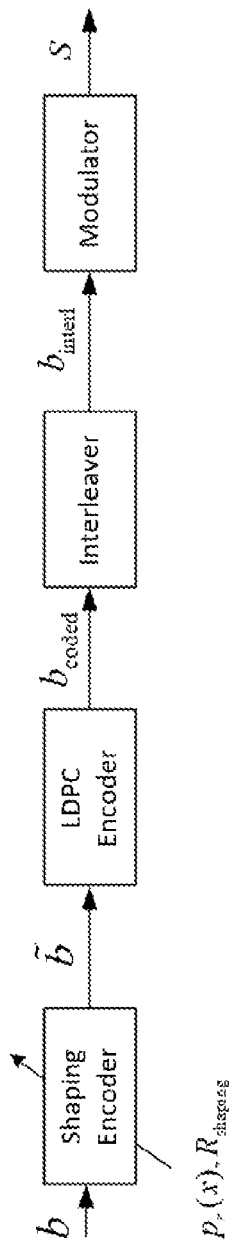
FIG. 4 is a transmitter block diagram in accordance with some embodiments.

In some embodiments, a constellation shaping WLAN transceiver (see FIG. 4) comprises: Prefix encoder that generates amplitudes with non-uniform distribution, Prefix encoding tables for different rates, Bit interleaver that manipulates the order of a bit sequence according to a defined order, LDPC framing and OFDM packing block that is crucial for implementation in WIFI systems, a demapper that calculates LLR based on the distribution of the constellation, and Shaping decoder that is inverse to the shaping encoder.

The transmitter block may comprise the following blocks: Shaping encoder with given probabilities and rate that applies the shaping on the input bits. The output of this block is shaped amplitudes (positive values only), mapped into their Grey code mapping, LDPC encoder generates parity bits for each codeword, an interleaver changes the order of the coded bits sequence in such a way that each amplitude will be followed by a single parity bit, modulator that maps the interleaved bits sequences into pulse-amplitude-modulations (PAMs) and QAMs symbols. Note that we match each positive amplitude a single parity bit. The parity bit is used for the sign of the symbol. This can be done since the parity bits are always equiprobable, which is necessary for symmetric constellations.

The rate of the scheme can be calculated as follows:

$$\text{Rate} = R_{shaping} \cdot R_{ldpc} \cdot \log_2(M) \quad (7)$$

Where $R_{shaping}$ is the rate of the shaping encoder, $R_{ldpc}$ is the rate of the LDPC encoder and M is the number of QAM symbols in constellations (i.e. 2, 4, 16, 64, 256, 1024, 4096).

In this scheme, we can use a single modulation and coding scheme ($R_{ldpc}$ and M) for different rates. This can be done using different shaping encoders—when more shaping is applied (less equiprobable), the rate is reduced due to the added redundancy.

Shaping Encoder

The shaping encoder transforms uniformly distributed bits sequence into amplitudes (positive values only), and into their corresponding Grey mapping. Basically, the encoder is a mapping table, which describes a prefix code.

Each sequence of bits at the input of the shaping encoder is mapped into an amplitude. The mapping table is constructed in such a way that the probabilities of the amplitudes will be according to some desired distribution, which are optimized in advance. The matching between a specific bit sequence and an amplitude is done by calculating the probability to get the specific bit sequence. Since the probability to get a bit sequence is always dyadic, i.e. can be written as $2^{-k}$ where k is integer, our block can only emulate dyadic probabilities.

We present here a short and simple example.

Consider the probabilities set [1/2, 1/4, 1/8, 1/8]. The appropriate mapping table would be as shown in Table. 1. If we observe a random bit sequence, the probability that the first bit is '0' is 0.5, therefore we can map '0' into amplitude 1. Meaning that if '0' is observed as first bit, we map it into amplitude and continue to the next bits. Follows, if '10' is received—amplitude 3 would be the output. This will occur a probability 0.25 as desired. The completing bit sequences in this case would be '110' and '111', which are given the amplitudes 5 and 7, and has exactly probability of 1/8. The amplitudes are then mapped into output bits using Grey code mapping.

| input | index | amplitude | Output bits | Prob. of sequence |
|-------|-------|-----------|-------------|-------------------|
| 0     | 1     | 1         | 10          | 1/2               |
| 10    | 2     | 3         | 11          | 1/4               |
| 110   | 3     | 5         | 01          | 1/8               |
| 111   | 4     | 7         | 00          | 1/8               |

Example for Shaping Encoder Mapping Table.

Example: Bin=(010011100110)→amplitude=(1 3 1 7 1 1 5)→Bout=(10111000101001)

Note that the mapping table was optimized for each required rate. The tables are given at the appendix.

Now we explain how to calculate the rate of the encoder.

Asymptotically, the number of bits per amplitude in this case approaches the entropy of the probabilities set. The number of output bit per amplitude is also known and is determined by the number of bits per PAM symbol. Consequently, the rate of the encoder would be $$\text{Entropy}(p_r) = \sum_{i=0}^{M-1} -p_r(x_i)\log_2(p_r(x_i)) \left[\frac{\text{bits}}{\text{amplitude}}\right] \quad (8)$$

$$R_{shaping} = \frac{|b_{in}|}{|b_{out}|} = \frac{\text{Entropy}(p_r)}{M_{pam} - 1}$$

Where $M_{pam}$ is the number of bits per PAM symbol. The minus 1 at the denominator accounts for the amplitude only (we only map bits into amplitudes and not complete symbols).

It also worth mentioning that this is a fixed-to-variable mapping, in the sense that different inputs at the same length would generate different output lengths. Meaning that there is some uncertainty in the number of output bits. The variance of this uncertainty goes to zero with the length of the input block size. We further discuss it in the LDPC framing and OFDM packing block.

LDPC Encoder

The LDPC encoder may be standard.

Interleaver

One main pillar in this method is the fact we use parity bits are sign of the PAM amplitudes.

The interleaver manipulates the order of the bit sequence such that each amplitude will be followed by a single sign (parity bits). In other words, the parity bits are the MSB of each PAM symbol.

An example is shown below:

Consider PAM16 (QAM256) which consists of 4 bits/symb. The coded bits arrive in sets of 3 bits (without the msb). The parity bits are at the end of the sequence since the encoder is systematic. The interleaver assign each 3 bits a single parity bit.

$$b_{coded} = (b, p) \Rightarrow (001\ 110\ 010\ \ldots\ 011\ \ldots) \ \text{--} > \ b_{interl} =$$
$$(\vec{b}_0, \vec{b}_1, \vec{b}_{m-1} p_0\ \ldots\ ) \Rightarrow (0010, 1101, 0101\ \ldots\ )$$

Modulator

The modulator maps the bits into amplitudes according to Grey mapping.

Figure 5:
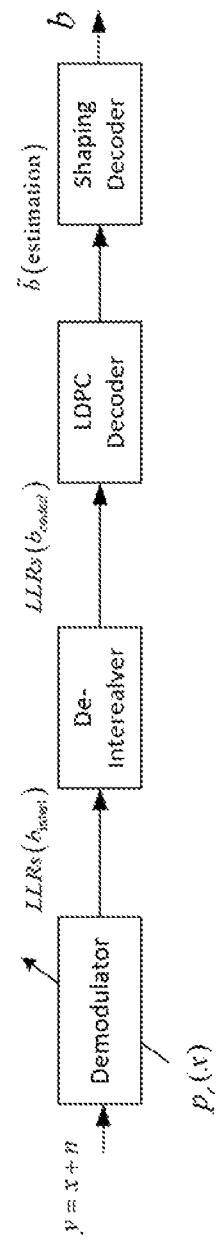
FIG. 5 is a receiver block diagram in accordance with some embodiments.

Receiver:

A block diagram of the receiver is shown in FIG. 5.

Demodulator

The demodulator extracts LLRs based on the input signals. The only change in the demodulator, compared to conventional Wi-Fi demodulator is the fact that we add the a-priori distribution to the computation.

This may be done as follows:

$$LLR(b_i) = \log\left(\frac{\sum_{k=1}^{K^{(1)}} p(y|s_k^{(1)})p_r(s_k^{(1)})}{\sum_{k=1}^{K^{(0)}} p(y|s_k^{(0)})p_r(s_k^{(0)})}\right) \approx \quad (9)$$

$$\max_k \{\log(p(y|s_k^{(1)})p_r(s_k^{(1)}))\} - \max_k \{\log(p(y|s_k^{(0)})p_r(s_k^{(0)}))\} =$$
$$\max_k \{\log(p(y|s_k^{(1)})) + \log(p_r(s_k^{(1)}))\} -$$
$$\max_k \{\log(p(y|s_k^{(0)})) + \log(p_r(s_k^{(0)}))\}$$

Where the red fonts accounts for the changes. A log operation of the a-priori distribution of each symbol is added to the original term. The change here is minor and is only an addition of some fixed number to the LLRs that usually calculated.

De-Interleaver

The de-interleaver is added to perform the inverse operation of the transmitter interleaver. Its task is to change the order of the LLRs such the LLRs that represent the parity bits will be assigned at the end of the sequence.

LDPC Decoder

The LDPC decoder may be standard, no changes are required.

Shaping Decoder

The shaping decoder performs the inverse operation of the shaping encoder. It re-transforms the shaped bits into the original payload bits.

We implemented the shaping decoder using a simple mapping table (inverse mapping table of the encoder).

| input | Output bits |
|-------|-------------|
| 10    | 0           |
| 11    | 10          |
| 01    | 110         |
| 00    | 111         |

Example for Shaping Decoder Mapping Table.

For the previous example:

Bin=(10111000101001)→Bout=(010011100110)

LDPC Framing and OFDM Packing

The LDPC framing and OFDM packing procedure is crucial to enable this feature in existing Wi-Fi standards.

The main issue is that the shaping encoder block is a fixed-to-variable transformation. That is, the number of output bit is not fixed, even though the number of input bits is fixed.

This interferes with the existing LDPC framing and OFDM packing procedure. In the current standard, the number of payload bits is known, and used to determine how to generate a coded OFDM packet. Two criterions must be met in order to generate a valid packet: (a) the number of input bits for each LDPC code word is fixed and (b) the number of total coded bits should be equal to the number of bits in OFDM symbols and (c) the number of OFDM symbols should be known in advance, so it could be transmitted in the headers.

Currently, the number of payload bits is used to calculate to following:

Number of payload bits in each LDPC code-word and number of shortening bits. Shortening bits refer to '0' bits that are used as input for the LDPC encoder for a fixed number.

Number of puncturing bits and repetition bits. After the LDPC encoding is performed, the number of coded bits is compared with the number of bits that should appear in the packet. In this stage puncturing or repetition is applied. In puncturing, parity bits are not transmitted and thus, the number of is reduced. If puncturing is not possible, repetition of the bits is used to add bits.

We propose a solution for the LDPC framing and OFDM packet when the CS method is applied. The solution accounts for 3 issues:

LDPC Framing

Fixed relation between the number of amplitudes bits and number of parity bits (that are used as MSB/sign bits)

OFDM packing—mapping bits into QAM symbols and OFDM tones.

LDPC Framing

The purpose of the LDPC framing is to divide the data into a complete number of LDPC words and add zero bits if necessary (shortening bits).

We suggest to do the computation by first evaluating the number of bits at the output of the shaping encoder and bound the maximal number of bits. If the number of bits at the shaping encoding is exceeded, then the transmission fails. We choose a number that ensures that this will happen rarely—with probability much lower than the required frame-error-rate.

If the number of output bits at the shaping encoder is lower than estimated, additional scrambled bits are added (bits with uniform distribution). We show that for long enough sequences, the amount of overhead bits (bits that are added for fixed length) is negligible compared to the number of payload bits. Hence, the degradation in throughput will be arbitrary small. Now that the number of output bits is fixed, we can compute the number of LDPC codewords, and number of bits in each codeword.

The formula used to compute the number of bits is $$b_{out} = \left\lceil b_{in} \cdot \frac{1}{\text{Entropy}(p_r)} \cdot (M_{pam} - 1) + B_{overhead} \right\rceil \quad (10)$$

Where Entropy($p_r$) is the entropy of the probability set being used in units of bits/symbol. ($M_{pam}$−1) is the number of bits/amplitude of one PAM symbol. $B_{overhead}$ is the number of bits that are added as overhead.

The method for computing the number of LDPC codewords and number of shortening bits is standard and is not discussed in this document.

For example, let us consider the following scenario:

$$b_{in} = 1e4, \ PAM32, \ \text{entropy}(p_r) = 3\left[\frac{\text{bits}}{\text{symbol}}\right],$$

$$R_{ldpc} = \frac{2}{3}, \ N_{codeword} = 1944.$$

We estimate the number of output bits as $$b_{out} = \left\lceil 1e4 \cdot \frac{1}{3} \cdot (5-1) + B_{overhead} \right\rceil = \lceil 1.3333e4 + B_{overhead} \rceil$$

In this case the number of LDPC codewords is $$N_{CW} = \left\lceil \frac{b_{out}}{N_{LDPC} R_{ldpe}} \right\rceil$$

and we can calculate the number of shortening bits for each codeword as $$N_{shrt} = \max(0, (N_{CW} \cdot N_{LDPC} \cdot R_{ldpe}) - b_{out})$$

$$N_{spcw} = \left\lfloor \frac{N_{shrt}}{N_{CW}} \right\rfloor$$

Where $N_{spcw}$ stands for number of shortening bits per code-word.

Fixed Relation Between the Number of Amplitudes Bits and Parity Bits

In the suggested method the relation between parity and amplitudes bits must be fixed. However, if shortening is applied prior to coding, than the number of amplitudes will be lower than expected.

In this case we suggest to do repetition of data bits. The number of repetition bits in this case is exactly the same as the number of shortening bits and is known in advance. This ensures fixed number of amplitudes and fixed relation between them and the number of parity bits.

At the receiver, LLR combining may be applied to improve the performance.

OFDM Packing

After the two first procedures are applied, the total number of coded bits would be exactly $N_{TBC}=N_{ldpc}N_{CW}$. Where $N_{ldpc}$ is the number of bits in each code-word (including the parity bits) and $N_{CW}$ is the number of code words which were calculated at stage 1. $N_{TCB}$ is the number of total coded bits. The number of OFDM symbols is calculated as $$N_{sym} = \left\lceil \frac{N_{TCB}}{N_{CBPS}} \right\rceil, \quad (11)$$

where $N_{CBPS}$ is the number of coded bits per OFDM symbol (which is derived by number of OFDM tones in each bit, and by the number of bits/QAM symbol). Here we suggest to always add additional OFDM symbol instead of puncturing. The degradation in throughput will be negligible if the packet is long enough.

To have a complete number of OFDM symbols repetition should be applied. The number of repetition bits would be $$N_{rep}=N_{sym} \cdot N_{CBPS}-N_{TCB}. \quad (12)$$

For each codeword, the number of repetition bits is derived as $$N_{rpcw} = \frac{N_{rep}}{N_{cw}} \quad (13)$$

Note that this repetition is applied after the interleaver. Therefore, the repetition is done while preserving the fixed relation between the number of amplitude bits and parity bits.

In some embodiments, a physical layer protocol data unit may be a physical layer conformance procedure (PLCP) protocol data unit (PPDU). In some embodiments, the AP and STAs may communicate in accordance with one of the IEEE 802.11 standards. IEEE draft specification IEEE P802.11ax/D4.0, February 2019 is incorporated herein by reference in its entirety. In some embodiments, the AP and STAs may be directional multi-gigabit (DMG) STAs or enhanced DMG (EDMG) STAs configured to communicate in accordance with IEEE 802.11ad standard or IEEE draft specification IEEE P802.11ay, February 2019, which is incorporated herein by reference.

In some embodiments, the mobile device may be part of a portable wireless communication device, such as a personal digital assistant (PDA), a laptop or portable computer with wireless communication capability, a web tablet, a wireless telephone, a smartphone, a wireless headset, a pager, an instant messaging device, a digital camera, an access point, a television, a medical device (e.g., a heart rate monitor, a blood pressure monitor, etc.), or other device that may receive and/or transmit information wirelessly. In some embodiments, the mobile device may include one or more of a keyboard, a display, a non-volatile memory port, multiple antennas, a graphics processor, an application processor, speakers, and other mobile device elements. The display may be an LCD screen including a touch screen.

The antennas may comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) embodiments, the antennas may be effectively separated to take advantage of spatial diversity and the different channel characteristics that may result.

Although the mobile device is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements may refer to one or more processes operating on one or more processing elements.

Embodiments may be implemented in one or a combination of hardware, firmware and software. Embodiments may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. Some embodiments may include one or more processors and may be configured with instructions stored on a computer-readable storage device.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus for a station (STA) configured for operating in a next-generation (NG) wireless local area network (WLAN), the apparatus comprising:
   transmitter circuitry, including processing circuitry; and memory,
   wherein for LDPC framing and OFDM packing, the transmitter circuitry is configured to divide payload bits into LDPC codewords, add shortening bits, and map a coded bit stream into QAM symbols and into OFDM tones for transmission,
   wherein for the LDPC framing and OFDM packing, the transmitter circuitry is configured to:
   compute a number of output bits ($b_{out}$) to be transmitted based on a number of payload bits ($b_{in}$) at an output of a shaping encoder, a shaping rate ($r_{shaping}$), and an overhead percent ($B_{overhead}$);

calculate a number of OFDM symbols ($N_{sym}$) based on the number of output bits ($b_{out}$) to be transmitted and a number of data bits per OFDM symbol ($N_{dbps}$);

calculate a number of LDPC codewords ($N_{CW}$) based on a number of codebits per LDPC codeword ($N_{LDPC}$), the code rate ($R_{ldpc}$), and the number of output bits ($b_{out}$);

calculate a number of shortening bits ($N_{shrt}$) to be appended to a LDPC codeword based on the number of output bits ($b_{out}$), a number of shorting bits per codeword ($N_{SPCW}$) and a number of codewords with additional shorting bits ($N_{SPCW1}$);

append a number of repetition bits ($N_{rep}$) after LDPC encoding based on whether an LDPC code rate matches a ratio between amplitude bits and sign bits of a target QAM level; and perform OFDM packing by adding the number of repetition bits ($N_{rep}$) after interleaving to fill the number of OFDM symbols ($N_{sym}$) including adding an additional OFDM symbol when a number of total coded bits ($N_{TCB}$) does not be fit into the number of OFDM symbols ($N_{sym}$).

2. The apparatus of claim 1, wherein the number of OFDM symbols ($N_{sym}$) is calculated using the following equation:

$$N_{sym} = \left\lceil \frac{b_{out}}{N_{dbps}} \right\rceil,$$

and wherein the number of LDPC codewords ($N_{CW}$) is calculated using the following equation:

$$N_{CW} = \left\lceil \frac{b_{out}}{N_{LDPC} R_{ldpc}} \right\rceil.$$

3. The apparatus of claim 2, wherein the number of shortening bits ($N_{shrt}$) to be appended to a LDPC codeword and the number of shorting bits per codeword ($N_{SPCW}$) are calculated using the following equations:

$$N_{shrt} = \max(0, (N_{CW} \cdot N_{LDPC} \cdot R_{ldpc}) - b_{out})$$

$$N_{spcw} = \left\lfloor \frac{N_{shrt}}{N_{CW} \cdot (M_{pam} - 1)} \right\rfloor (M_{pam} - 1),$$

and the number of codewords with additional shorting bits ($N_{SPCW1}$) is calculated using the following equation:

$$N_{spcw1} = \mathrm{rem}(N_{shrt}, N_{CW} \cdot (M_{pam} - 1)).$$

4. The apparatus of claim 3, wherein the number of repetition bits to be appended after LDPC encoding is equal to the number of shortening bits when the LDPC code rate matches the ratio between amplitude bits and sign bits of the target QAM level, and when the LDPC code rate does not match the ratio between amplitude bits and sign bits of the target QAM level, repetition bits are appended, or puncturing is applied so that the ratio between the amplitude bits and sign bits meets the target QAM level.

5. The apparatus of claim 4, wherein padding bits are added to the number of payload bits ($b_{in}$) to calculate the number of OFDM symbols ($N_{sym}$) based on the shaping rate ($r_{shaping}$) using the following equation:

$$b_{in} = b_{out} \cdot r_{shaping}.$$

6. The apparatus of claim 5, wherein the number of repetition bits ($N_{rep}$) to completely fill up the number of OFDM symbols ($N_{sym}$) is calculated using the following equation:

$$N_{rep} = N_{sym} \cdot N_{CBPS} - N_{TCB}.$$

7. The apparatus of claim 1, wherein the transmitted circuitry is configured to compute the number of output bits ($b_{out}$) using the following equation:

$$b_{out} = \left\lceil 1e4 \cdot \left( \frac{4}{3} + 0.01 \right) \right\rceil = \left\lceil \frac{1e4}{r_{shaping}} \right\rceil,$$

where $r_{shaping} = \left( \frac{4}{3} + 0.01 \right)^{-1}.$

8. The apparatus of claim 7, wherein the processing circuitry comprises a baseband processor.

9. The apparatus of claim 8 wherein the transceiver circuitry is configured to be coupled to two or more antennas for a MIMO transmission of the number of OFDM symbols ($N_{sym}$).

10. The apparatus of claim 9, wherein the memory is configured to store the number of OFDM symbols ($N_{sym}$).

11. A non-transitory computer-readable storage medium that stores instructions for execution by processing circuitry a station (STA) for operating in a next-generation wireless local area network (WLAN), the instructions to configure the STA for LDPC framing and OFDM packing, wherein transmitter circuitry is configured by the processing circuitry to divide payload bits into LDPC codewords, add shortening bits, and map a coded bit stream into QAM symbols and into OFDM tones for transmission, wherein for the LDPC framing and OFDM packing, the transmitter circuitry is configured to:

compute a number of output bits ($b_{out}$) to be transmitted based on a number of payload bits ($b_{in}$) at an output of a shaping encoder, a shaping rate ($r_{shaping}$), and an overhead percent ($B_{overhead}$);

calculate a number of OFDM symbols ($N_{sym}$) based on the number of output bits ($b_{out}$) to be transmitted and a number of data bits per OFDM symbol ($N_{dbps}$);

calculate a number of LDPC codewords ($N_{CW}$) based on a number of codebits per LDPC codeword ($N_{LDPC}$), the code rate ($R_{ldpc}$), and the number of output bits ($b_{out}$);

calculate a number of shortening bits ($N_{shrt}$) to be appended to a LDPC codeword based on the number of output bits ($b_{out}$), a number of shorting bits per codeword ($N_{SPCW}$) and a number of codewords with additional shorting bits ($N_{SPCW1}$);

append a number of repetition bits ($N_{rep}$) after LDPC encoding based on whether an LDPC code rate matches a ratio between amplitude bits and sign bits of a target QAM level; and perform OFDM packing by adding the number of repetition bits ($N_{rep}$) after interleaving to fill the number of OFDM symbols ($N_{sym}$) including adding an additional OFDM symbol when a number of total coded bits ($N_{TCB}$) does not be fit into the number of OFDM symbols ($N_{sym}$).

12. The non-transitory computer-readable storage medium of claim 11, wherein the number of OFDM symbols ($N_{sym}$) is calculated using the following equation:

$$N_{sym} = \left\lceil \frac{b_{out}}{N_{dbps}} \right\rceil,$$

and
wherein the number of LDPC codewords ($N_{CW}$) is calculated using the following equation:

$$N_{CW} = \left\lceil \frac{b_{out}}{N_{LDPC} R_{ldpc}} \right\rceil.$$

13. The non-transitory computer-readable storage medium of claim 12, wherein the number of shortening bits ($N_{shrt}$) to be appended to a LDPC codeword and the number of shorting bits per codeword ($N_{SPCW}$) are calculated using the following equations:

$$N_{shrt} = \max(0, (N_{CW} \cdot N_{LDPC} \cdot R_{ldpc}) - b_{out})$$

$$N_{spcw} = \left\lfloor \frac{N_{shrt}}{N_{CW} \cdot (M_{pam} - 1)} \right\rfloor (M_{pam} - 1),$$

and
the number of codewords with additional shorting bits ($N_{SPCW1}$) is calculated using the following equation:

$$N_{spcw1} = \text{rem}(N_{shrt}, N_{CW}(M_{pam}-1)).$$

14. The non-transitory computer-readable storage medium of claim 13, wherein the number of repetition bits to be appended after LDPC encoding is equal to the number of shortening bits when the LDPC code rate matches the ratio between amplitude bits and sign bits of the target QAM level, and
when the LDPC code rate does not match the ratio between amplitude bits and sign bits of the target QAM level, repetition bits are appended, or puncturing is applied so that the ratio between the amplitude hits and sign bits meets the target QAM level.

15. The non-transitory computer-readable storage medium of claim 14, wherein padding bits are added to the number of payload bits ($b_{in}$) to calculate the number of OFDM symbols ($N_{sym}$) based on the shaping rate ($r_{shaping}$) using the following equation:

$$b_{in} = b_{out} \cdot r_{shaping}.$$

16. The non-transitory computer-readable storage medium of claim 15, wherein the number of repetition bits ($N_{rep}$) to completely fill up the number of OFDM symbols ($N_{sym}$) is calculated using the following equation:

$$N_{rep} = N_{sym} \cdot N_{CBPS} - N_{TCB}.$$

17. The non-transitory computer-readable storage medium of claim 11, wherein the transmitted circuitry is configured to compute the number of output bits ($b_{out}$) using the following equation:

$$b_{out} = \left\lceil 1e4 \cdot \left( \frac{4}{3} + 0.01 \right) \right\rceil = \left\lceil \frac{1e4}{r_{shaping}} \right\rceil,$$

where $r_{shaping} = \left( \frac{4}{3} + 0.01 \right)^{-1}.$

* * * * *